United States Patent [19]
Nauta et al.

[11] Patent Number: 5,126,697
[45] Date of Patent: Jun. 30, 1992

[54] VOLTAGE CONTROLLED OSCILLATOR WITH A RESONANT NETWORK AND A REACTIVE NETWORK, HAVING A CONTROL LOOP BETWEEN THE NETWORKS

[75] Inventors: Hendrikus C. Nauta, Nootdorp; Ernst H. Nordholt, Berkel En Rodenrijs, both of Netherlands

[73] Assignee: Catena Micro-Electronics B.V., Delft, Netherlands

[21] Appl. No.: 616,400

[22] Filed: Nov. 21, 1990

[30] Foreign Application Priority Data

Nov. 23, 1989 [NL] Netherlands ............ 8902900

[51] Int. Cl.⁵ ............... H03B 5/08; H03L 1/00; H03C 3/22
[52] U.S. Cl. .................. 331/177 R; 331/176; 331/177 V; 331/183; 332/136
[58] Field of Search ........... 331/176, 177 R, 117 V, 331/183; 332/136

[56] References Cited

U.S. PATENT DOCUMENTS 4,063,194 12/1977 Helle .............. 331/177 V X
4,518,930 5/1985 Rozema et al. ........ 331/36 C

FOREIGN PATENT DOCUMENTS 0044528 1/1982 European Pat. Off.

OTHER PUBLICATIONS

Patent Abstracts of Japan, vol. 9, No. 199, p. 380, 16 Aug. 1985 (Abstract of Japanese Patent 60063471 data 11 Apr. 1985, Inventor, Kiyotaka).

Primary Examiner—Siegfried H. Grimm
Attorney, Agent, or Firm—Christie, Parker & Hale

[57] ABSTRACT

Voltage controlled oscillator provided with a resonant network, an amplifier and a reactive network, all incorporated in an oscillator loop, the reactive network having one or more reactive components whose values depend on a control signal fed to a control input, so that the oscillator frequency can be regulated with said control signal. A control loop is provided between the resonant network and the reactive network, with which control loop the difference is determined between a measure of the imaginary part of the impedance or admittance of the resonant network and the control signal acting as reference quantity. The imaginary part of the impedance or admittance of the reactive network is regulated with said difference. The control loop contains a derivation circuit for deriving said measure and a differential amplifier, to one input of which the output signal of the derivation circuit is fed and to the other input of which the control signal is fed.

18 Claims, 3 Drawing Sheets

VOLTAGE CONTROLLED OSCILLATOR WITH A RESONANT NETWORK AND A REACTIVE NETWORK, HAVING A CONTROL LOOP BETWEEN THE NETWORKS

BACKGROUND OF THE INVENTION

The invention relates to a voltage controlled oscillator provided with a resonant network, an amplifier and a reactive network, all incorporated in an oscillator loop, the reactive network having one or more reactive components whose values depend on a control signal fed to a control input, so that the oscillator frequency can be regulated with said control signal. Such a voltage controlled oscillator is known from the Netherlands Patent Application 8800119.

By presenting a temperature-dependent signal to the control input in the case of such a voltage controlled oscillator, which is usually termed a VCO or, in the case where the resonant network is a quartz crystal, a VCXO, it is also possible to compensate for the temperature variation of the oscillator frequency. Such oscillators are known as TCOs or, in the case where the resonant network is a quartz crystal, as TCXOs (temperature compensated crystal oscillator).

The variable reactive component or variable reactance, for example formed by a varactor diode, associated with the reactive network, may be incorporated optionally in combination with other reactive components in series with or parallel to the resonant network, but may also be incorporated at another position in the oscillator loop. The component does not necessarily have to be passive and other active reactance circuits are also suitable. In the latter case, the controllability can be obtained by varying, for example, a gain factor or a resistor. The implementation will always have to be such that the frequency, for which the imaginary part of the gain $A_L$ round the oscillator loop becomes equal to zero, can be influenced by the value of the regulable reactive component. The reason is that it is only for this value of the imaginary part that the first Barkhausen oscillation condition, i.e. $Im\{A_L\}=0$, can be fulfilled.

The values of the reactive components in the reactive network are, in general, not accurately known, dependent upon temperature and nonlinear. In order to cause the oscillator frequency to be accurately determined by the resonant network in the quiescent situation, i.e. in the absence of a control signal, it is necessary for the imaginary part of the loop gain introduced by the oscillator amplifier and the reactive components of the reactive network to be made equal to zero. Normally this is done by means of an adjustment of the component values of the reactive components in the reactive network. Said component values are, however, dependent on the temperature and their temperature coefficients are subject to spread. In addition, the relationship between component value and control signal is, in general, not linear and this nonlinearity is also subject to spread. In order to be able to control the oscillator frequency in a well defined way, for example in order to achieve a linear relationship between control signal and frequency variation, as is desirable in VC(X)Os or in order to compensate for the temperature variation of the oscillator frequency as is desirable in TC(X)Os, it is first necessary to carry out measurements in order to determine the relationships between control signal and frequency, or between temperature and frequency. Only if these relationships, which have to be measured separately for every oscillator owing to the component spread, are known, is it possible to design correction networks so that the desired linearity or temperature independence is obtained. These procedures are time-consuming and therefore expensive.

In the voltage controlled oscillator known from the abovementioned patent application, the effect of inaccuracy, dependence on temperature and nonlinearity of the reactive components are substantially eliminated. For this purpose, the said reactive network in the oscillator, which is in this case a phase shifting network, is provided with a separate control loop having a phase detector which is so designed that the sensitivity of the oscillator is accurate and constant even with variation in temperature. For this purpose, a phase shift which is directly proportional to the control signal is impressed on the phase shifting network by means of the phase detector. As a result of this, the oscillator frequency, and its variation with the voltage or current of the control signal, is completely determined by the resonant network.

A problem in this connection is, however, that the quality factor of the resonant network plays a role in said variation and also that said variation is nonlinear. For this reason an accurate control of the quality factor is required in manufacturing the resonant network to realise an accurate voltage controlled or temperature compensated (crystal) oscillator in accordance with this principle. The control of the reproducibility of said quality factor is, in general, extremely difficult.

Depending on the implementation of the phase shifting network of this known voltage controlled oscillator, a second problem may arise. The real part of the small-signal loop gain may vary considerably as a result of alteration of the phase shift. For oscillation, the real part of the gain round the loop must, according to the second Barkhausen condition, always be greater than unity. The amplifier incorporated in the oscillator loop must therefore be designed in a manner such that this second condition is fulfilled for all the required phase shifts. In practice it is known that the large loop gain required for this is at the expense of the short-term stability.

SUMMARY OF THE INVENTION

The object of the invention is to eliminate these disadvantages and problems. This is achieved, according to the invention, in a voltage controlled oscilator of the type mentioned in the preamble in that a control loop is provided between the resonant network and the reactive network, with which control loop the difference is determined between a measure of the imaginary part of the impedance or admittance of the resonant network and the control signal acting as reference quantity, the imaginary part of the impedance or admittance of the reactive network being regulated with said difference.

In an advantageous embodiment according to the invention, a derivation circuit is provided in the control loop for deriving the said measure and a differential amplifier, to one input of which the output signal of the derivation circuit is fed and to the other input of which, which acts as control input, the control signal is fed.

In contrast to the method in the case of the known voltage controlled oscillator, it is not the phase of the phase shifting network which is measured and controlled by means of a control loop but in this design according to the invention it is the imaginary part of the impedance or admittance of the resonant network which is controlled by means of an essentially differently embodied control loop with the aid of the control signal or reference quantity. This method has the advantage that the relationship between the control signal and frequency variation can be made linear to a very good approximation and the sensitivity depends only on one parameter of the resonant network which can be controlled better during manufacture.

BRIEF DESCRIPTION OF THE DRAWINGS

The invention will be explained in greater detail on the basis of some exemplary embodiments with reference to the drawings, in which.

DETAILED DESCRIPTION OF THE PREFERRED EMBODIMENT

Figure 1:
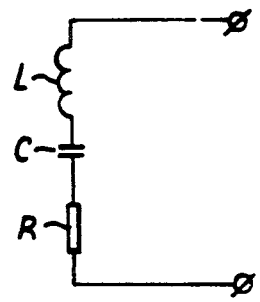
FIG. 1 shows an example of a resonant network formed by an LCR series circuit.

To illustrate the oscillator according to the invention, an example is first given of the case where the resonant network is formed by an LCR series circuit according to FIG. 1. Incorporated in the oscillator loop is, moreover, an amplifier $A_1$ which is provided with feedback such that the port to which the resonant network is connected represents a negative real resistance. This basic configuration of an oscillator having a series resonant network is known from the thesis "The design of high performance negative feedback oscillators", 1989, Delft University of Technology, by C. A. M. Boon and shown in FIG. 2. For the sake of simplicity, it is assumed that the amplifier $A_1$ behaves as an ideal nullor. The input resistance at the resonator port is then given by $$R_i = -\frac{R_2 R_1}{R_3}$$

Figure 2:
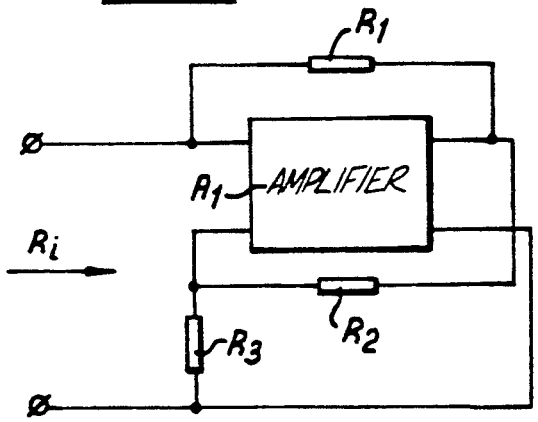
FIG. 2 shows an example of an amplifier belonging to the oscillator loop and having a negative real resistance at the input effected by the associated feedback, to which input the resonant network is connected.
Figure 3:
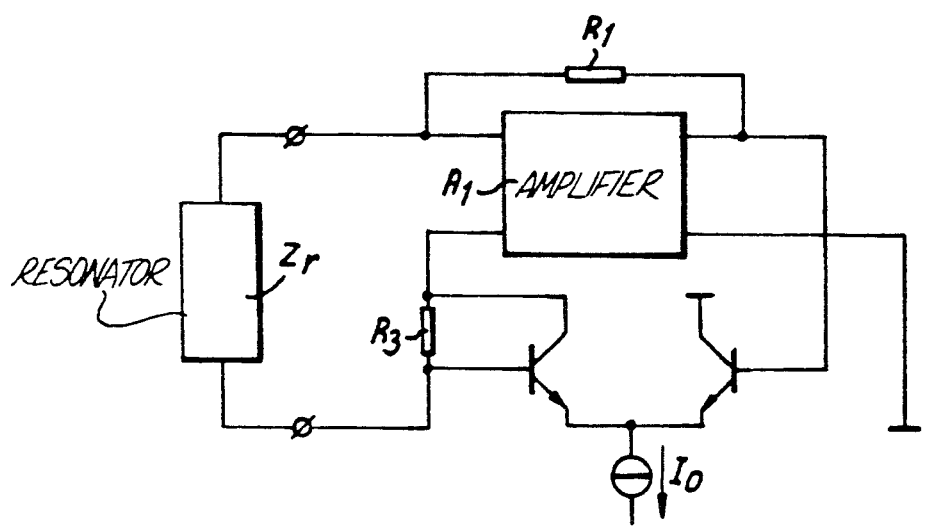
FIG. 3 shows another embodiment of the amplifier shown in FIG. 2.

By replacing one of the resistors by a non-linear resistor, the limiting action necessary for a stable oscillator amplitude is obtained. In the example, this is achieved by using, according to FIG. 3, a limiting differential amplifier configuration instead of $R_2$. The voltage impressed on the LCR resonator $Z_r$ is now approximately of square wave form and has a peak-peak value equal to $I_o R_3$. As a result of the filtering action of the resonant network, the current in said network is virtually sinusoidal and, consequently, so is the output voltage. The magnitude of the output voltage is predominantly determined by the series resistance of the circuit and the magnitude of $R_1$. The Barkhausen conditions for oscillation can in this case be written as:

$$Im\{Z_r\} = 0$$

$$R \leq R_i$$

where $R_i$ represents the small-signal value of the input resistance of the amplifier of FIG. 2 and $Im\{Z_r\}$ is the imaginary part of the complex impedance $Z_r$ and given by:

$$Im\{Z_r\} = (\omega L - 1/\omega C)$$

The oscillator radian frequency $\omega_o$ follows from the first requirement as $$\omega_o = 1/\sqrt{LC}.$$

Figure 4:
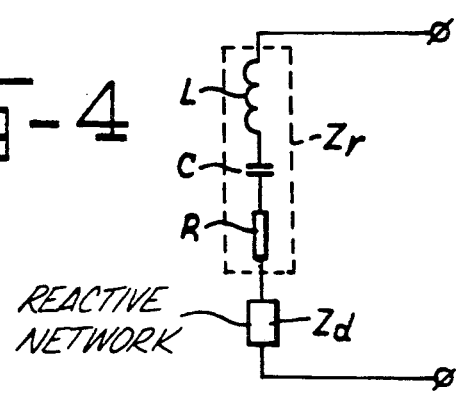
FIG. 4 shows an example of a series circuit of a series resonant network and a regulable reactive component.

The regulability of the frequency is obtained in this example in the known manner by incorporating a reactive regulable component or reactive network $Z_d$ in series with the resonator $Z_r$ according to FIG. 4. A representative example of such a component is the varactor diode. If said diode can be modelled as a voltage controlled capacitor, this series circuit results in the same condition for R. The condition for $Im\{Z_r\}$ now results, however, in $(\omega L - 1/\omega C_d$, where $C_d$ represents the capacitive value of the varactor. In other words, in order to fulfill the first Barkhausen condition, the imaginary part of the resonator impedance must be equal to the imaginary part of the reactive series component but have an opposite sign. Both the imaginary part of the resonator impedance and the imaginary part of the reactive series component are therefore a measure of the frequency change.

Figure 5:
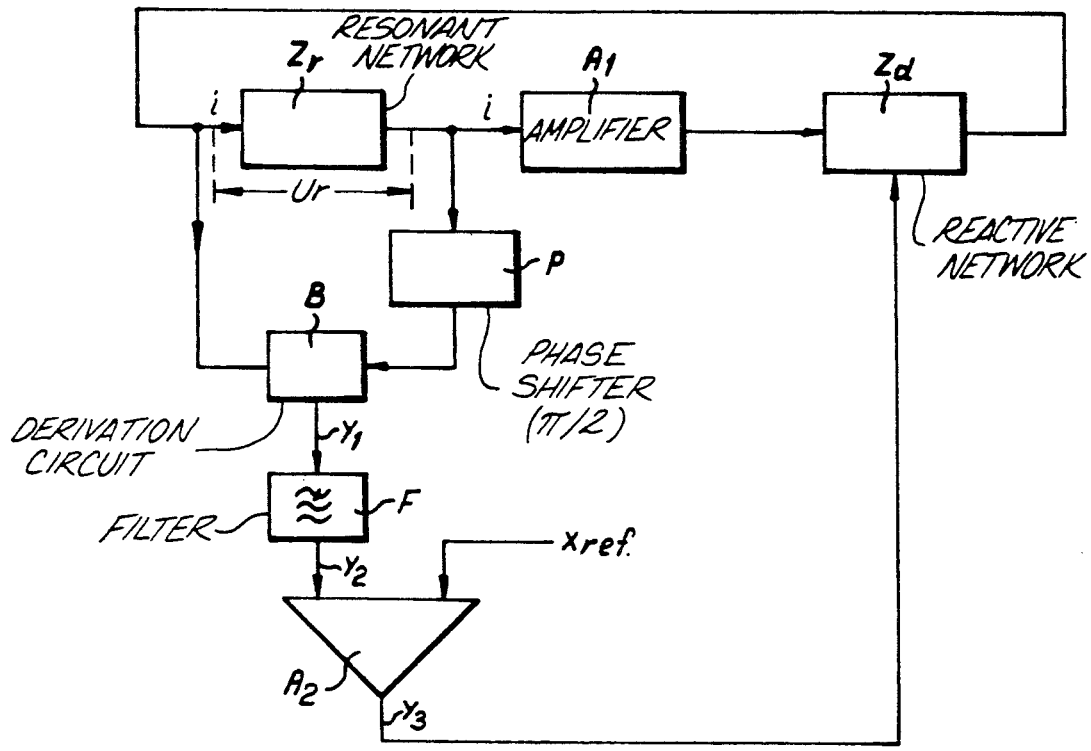
FIG. 5 shows an embodiment of the voltage controlled oscillator according to the invention.

FIG. 5 now shows an embodiment according to the invention based on this principle. In this example, the oscillator loop comprises, as is normal, a resonant network $Z_r$, an amplifier $A_1$ and a reactive network $Z_d$. To measure one of the two said imaginary parts, we provisionally assume in this example that the current through the series circuit of the resonator and the reactive network is constant. If we write this current as $i = \hat{i} \cdot \sin(\omega t)$, the voltage $V_r$ across the resonator $Z_r$ can then be written as $U_r = \hat{i} \cdot |Z_r| \cdot \sin(\omega t + \phi)$ in this equation, where $|Z_r|$ represents the modulus of the complex impedance of the resonator or resonant network $Z_r$.

By causing the voltage $U_r$ across the resonant network to undergo a phase shift of $\pi/2$ in the phase shifter P and then multiplying this phase-shifted quantity by the current i through the resonant network in a derivation circuit B, one obtains a quantity $y_1$ which is given by $$y_1 = \hat{i}^2 \cdot |Z_r| \cdot \sin(\omega t + \phi) \cdot (\cos\omega t) =$$
$$= \hat{i}^2 \cdot |Z_r| \cdot [\sin(2\omega t + \phi) + \sin\phi]$$

The frequency component in $2\omega$ can be removed by means of a low pass filter F and there remains a signal $$y_2 = \hat{i}^2 \cdot |Z_r| \cdot \sin\phi = \hat{i}^2 \cdot Im\{Z_r\}$$

Because i has been assumed constant, $y_2$ is therefore a measure of the imaginary part of the resonator impedance $Z_r$.

Figure 7:
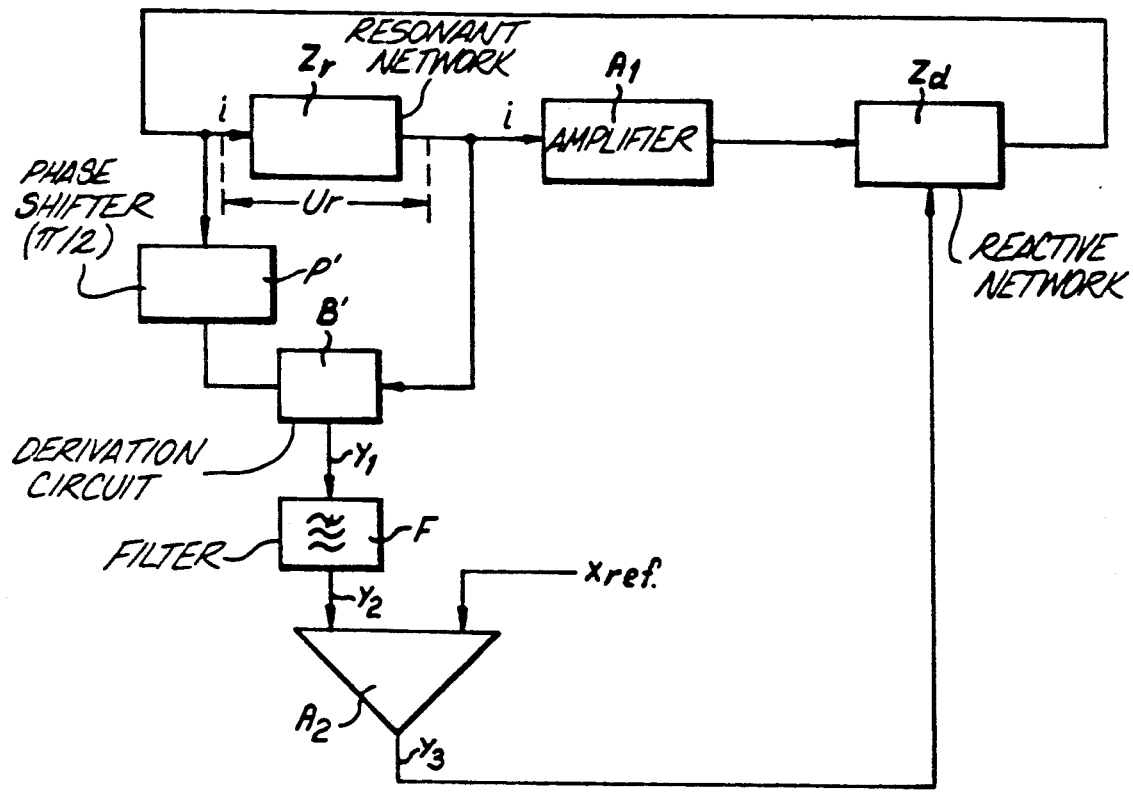
FIG. 7 shows a variation of the voltage controlled oscillator of FIG. 5.

The same quantity $y_2$ is obtained by causing the current i through the resonant network to undergo a phase shift of $\pi/2$ at phase shifter P' and then multiplying this phase-shifted quantity by the voltage $U_r$ across the resonant network in the derivation circuit B'. After low-pass filtering of the output quantity $y_1$ of this derivation circuit, the quantity $y_2$ is obtained, as shown in FIG. 7, which is otherwise the same as FIG. 5.

In a differential amplifier $A_2$, the difference between the quantity $y_2$ and the external control signal of the oscillator or reference quantity $x_{ref}$ is subsequently amplified. It is pointed out that $y_2$ and the reference quantity may have the dimension either of voltage or current, depending on the design of the amplifier, the multiplier and the low pass filter. The output signal $y_3$ of the amplifier is used to influence the value of one or more reactive components in the reactive network $Z_d$. If the value of the gain is sufficiently large, the difference between $y_2$ and the reference quantity approaches zero for a finite output signal of the amplifier (control signal of the reactive component).

From the above it becomes clear that if this control loop according to the invention is used, the imaginary part of the resonator impedance is accurately determined by the reference quantity according to $$Im\{Z_r\} = x_{ref} / \hat{i}^2.$$

If $x_{ref}$ is made equal to zero, $Im(Z_r)$ also becomes equal to zero and the oscillator frequency is precisely equal to the resonance frequency of the resonator. In the present example, this means that the capacitance of the controlled reactive component would have to become infinitely large. This is, of course, an impractical situation. However, by incorporating a self-inductance in series with said component in this example, the imaginary part of the reactive impedance can in fact be regulated to zero. The only condition for achieving this is that the amplifier still operates in its normal active region with the required value of the reactive component. The inaccuracy, non-linearity and the temperature dependence of the reactive components in the controllable reactive network do not play any role at all in this case.

The imaginary part of the resonator impedance is directly proportional to the quantity $x_{ref}$ as a result of using the control loop according to the invention. With an accurately known relationship between the said imaginary part and the frequency, it is therefore possible to realise an accurate VCO. If the resonator according to the example is used, this relationship between frequency and imaginary part is given by $$Im\{Z_r\} = (\omega L - 1/\omega C).$$

In the vicinity of the resonance frequency $\omega_r = 1/\sqrt{LC}$, the derivative of the imaginary part with respect to $\omega$ is given by $$\frac{d(Im\{Z_r\})}{d\omega}\bigg|_{\omega_r} = 2L$$

If the value of L can be controlled well in the reproduction process, the sensitivity of the VCO in the vicinity of $\omega_r$ is also well known. For a frequency change which is not too great with respect to $\omega_r$, the relationship between the imaginary part and $\omega$ is, in addition, linear to a good approximation. This means that the relationship between $x_{ref}$ and $\omega$ is also linear and that without having to use compensation networks, linear frequency modulation, for example, can be obtained with a small frequency swing. Although the use of non-linearity compensation is necessary to maintain linearity with a larger swing, the control loop according to the invention also has, in this case, the advantage that the type of non-linearity to be compensated for is accurately known. The accurately known relationship between $x_{ref}$ and the oscillator frequency offers the possibility, moreover, of accurately compensating for the variation in the oscillator frequency with temperature. For this purpose, only the variation of the resonance frequency of the resonant network with temperature needs to be known. In order to achieve a compensation, $x_{ref}$ is derived from a signal, generated with the aid of a temperature sensor, via a suitably chosen network. In this way, an accurate TC(X)0 is produced. It is obvious that the temperature compensation can be used in combination with the frequency modulation mentioned earlier.

Figure 8:
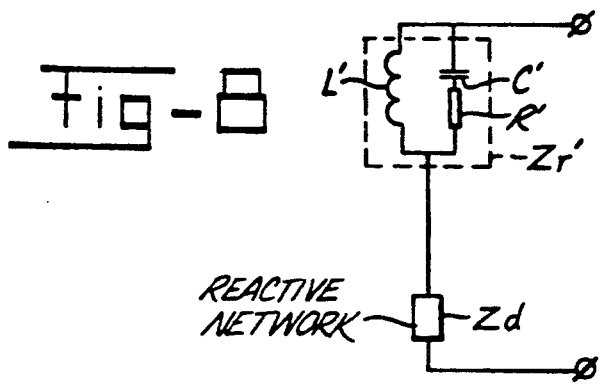
FIG. 8 shows an example of a series circuit of a parallel resonant network and a regulable reactive component.

The example given above is only intended as an illustration of the control loop according to the invention. The control loop is, however, in no way limited to the specific embodiments of the various basic functions used in the example, such as series resonant network, the reactive network, the amplifier configuration, etc. All series and parallel resonant networks, and also resonators which can be modelled as such, can serve as a starting point for the design of an oscillator according to the invention. An example of a parallel resonant network $Z_r'$ is shown in FIG. 8, using L', C', and R', which is otherwise the same as FIG. 4. It will be clear that because of duality in the case of parallel resonant networks, the imaginary part of the admittance must be controlled in order to obtain one and the same effect as in a series resonant network and that where the voltage or current, respectively, is mentioned in the case of series resonant networks, the same considerations apply to current or voltage, respectively, in parallel resonant networks. Characteristic of the invention is always the fact that the imaginary part of the resonator impedance or admittance is controlled by controlling the imaginary part of the impedance or admittance of a reactive network in the oscillator loop by means of a control loop and that, in the control loop, the difference between the external control signal or reference quantity and a measure of the imaginary part of the resonator impedance (or admittance) or of the impedance (or admittance) of the reactive network is amplified in order to form the control signal for the reactive network.

To clarify the invention further, possible embodiments of specific basic functions and possible additional provisions needed will be dealt with below.

In the embodiment of FIG. 5, the starting point was a series LRC resonant network $Z_r$ and a controllable reactive network $Z_d$ assumed to be loss-free. In this case, the real part of the series impedance of both networks is determined entirely and exclusively by the series resistance R of the resonant network. To obtain or derive a measure of the imaginary part of the impedance of one of the two networks, a determination of a current/voltage relationship is necessary. This determination, as in the derivation circuit B in FIG. 5, can be carried out in various ways. In the example it has been assumed that the current through the series circuit of the two networks is constant. This assumption is not practical. In addition to the multiplication used in the example, a measure of the imaginary part can also, of course, be obtained by means of a division of a voltage and a current. However, this does not result in a solution which is practically simple to implement. Keeping the current through the resonant network constant or, if the imaginary part of the admittance of the resonant network is measured, keeping the voltage across the resonant network constant does in fact result in readily implementable solutions. In general, however, a separate provision will have to be made to achieve this constancy. Both compensation techniques and feedback techniques are suitable for this purpose. If it is assumed that, for example, in a series resonant network the real part of the total impedance varies with the frequency as well as with the temperature and is also not accurately known, the use of a feedback technique is the most effective. For the purpose of using this feedback, an accurate measure $A_m$ needs to be obtained for the current through the resonant network. The difference between said measure $A_m$ and a reference quantity $v_{ref}$ is amplified and the current through the resonator is regulated with the amplified signal. If the gain large, the difference between the measured quantity and the reference quantity $(A_m - v_{ref})$ then becomes very small and if the reference quantity $v_{ref}$ is constant and accurately known, the current through the resonator is also constant and accurately known. Such control loops which keep a current through an impedance constant but which can, of course, also be used to keep the voltage across an admittance constant are known in practice and are often designated automatic gain controls.

Figure 6:
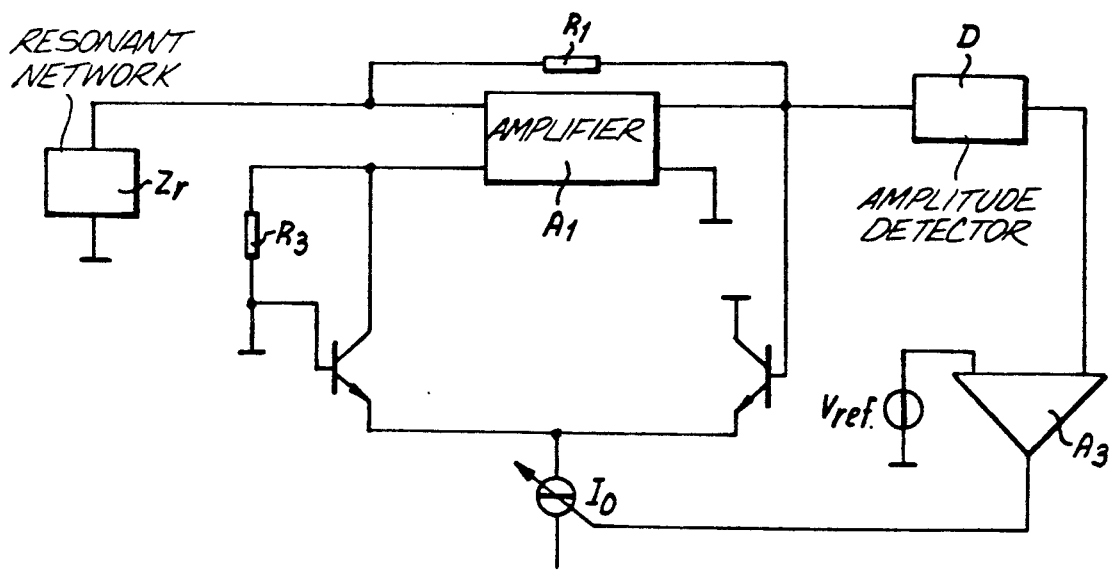
FIG. 6 shows an example of an automatic gain control loop for use in the voltage controlled oscillator according to the invention.

In the example of an oscillator according to the invention given earlier, such an automatic gain control can be implemented in a simple manner as shown in FIG. 6. At the output of the oscillator amplifier $A_1$, for example, a signal is available which, if $R_1$ is a precision resistor, is an accurate measure of the current. This alternating voltage can be converted into a direct voltage with the aid of an accurate amplitude detector D. The difference between said direct voltage and a reference voltage $v_{ref}$ is amplified in a large-gain amplifier $A_3$ and the current source $I_o$ of the limiting differential amplifier is regulated by the output signal of said amplifier $A_3$.

In the example, a measure of the imaginary part of the impedance of the resonant network or of the impedance of the reactive network is obtained with the aid of a multiplication circuit. This circuit may be either a so-called analog multiplier or a so-called switching multiplier. In the first case, the output signal is proportional to $i^2$ as in the example. In the second case, a proportionality with i is obtained. The switching multiplier has the advantage that the signal which is fed to the input to which a measure of the current $A_m$ is fed in the example can be limited in amplitude. This results in a simple embodiment of the $\pi/2$ phase shifting network. If the quantity related to the resonator current is already limited, the $\pi/2$ phase shift can be achieved by a simple integrator circuit. The triangular signal obtained in this way can then be used, as a result of re-limiting, as input signal for the switching channel of the switching multiplication circuit. The said implementation possibilities make the oscillator circuit according to the invention suitable, in particular, for monolithic integration and therefore for cheap mass production.

What is claimed is:

1. Voltage controlled oscillator provided with a resonant network, an amplifier and a reactive network, all incorporated in an oscillator loop, the reactive network having at least one reactive component whose value depends on a control signal fed to a control input, so that the oscillator frequency can be regulated with said control signal, characterised in that a control loop is provided between the resonant network and the reactive network, with which control loop the difference is determined between a measure of the imaginary part of the impedance of the resonant network and the control signal acting as reference quantity, the imaginary part of the impedance of the reactive network being regulated with said difference.

2. Voltage controlled oscillator according to claim 1, characterized in that the control loop contains a derivation circuit for deriving said measure and a differential amplifier, to one input of which the output signal of the derivation circuit is fed and to the other input of which, which acts as control input, the control signal is fed.

3. Voltage controlled oscillator according to claim 2, characterized in that the derivation circuit is a multiplier, and there is a $\pi/2$ phase shifter which is incorporated in series with one input thereof and with which multiplier a measure, phase-shifted by $\pi/2$, of the current through the resonant network is multiplied by a measure of the voltage across said network and in that a low pass filter is incorporated between the output of the multiplier and the one input of the differential amplifier.

4. Voltage controlled oscillator according to claim 2, characterized in that the derivation circuit is a multiplier, and there is a $\pi/2$ phase shifter which is incorporated in series with one input thereof and with which multiplier a measure, phase-shifted by $\pi/2$, of the voltage across the resonant network is multiplied by a measure of the current through said network and in that a low pass filter is incorporated between the output of the multiplier and the one input of the differential amplifier.

5. Voltage controlled oscillator according to claim 3 or 4, characterized in that the multiplier is an analog multiplier.

6. Voltage controlled oscillator according to claim 3 or 4, characterized in that the multiplier is a switching multiplier.

7. Voltage controlled oscillator according to claim 1, 2, 3, or 4, in which the resonant network is of the series-resonant type, characterized in that an automatic gain control loop is provided in order to keep the current through the impedance of the resonant network constant.

8. Voltage controlled oscillator provided with a resonant network, an amplifier, and a reactive network, all incorporated in an oscillator loop, the reactive network having at least one reactive component whose value depends on a control signal fed to a control input, so that the oscillator frequency can be regulated with said control signal, characterized in that a control loop is provided between the resonant network and the reactive network, with which control loop the difference is determined between a measure of the imaginary part of the admittance of the resonant network and the control signal acting as reference quantity, the imaginary part of the admittance of the reactive network being regulated with said difference.

9. Voltage controlled oscillator according to claim 8, characterized in that the control loop contains a derivation circuit for deriving said measure and a differential amplifier, to one input of which the output signal of the derivation circuit is fed and to the other input of which, which acts as control input, the control signal is fed.

10. Voltage controlled oscillator according to claim 9, characterized in that the derivation circuit is a multiplier, and there is a $\pi/2$ phase shifter which is incorporated in series with one input thereof and with which multiplier a measure, phase-shifted by $\pi/2$, of the voltage across the resonant network is multiplied by a measure of the current through said network and in that a low pass filter is incorporated between the output of the multiplier and the one input of the differential amplifier.

11. Voltage controlled oscillator according to claim 9, characterized in that the derivation circuit is a multiplier, and there is a $\pi/2$ phase shifter which is incorporated in series with one input thereof and with which multiplier a measure, phase-shifted by $\pi/2$, of the current through the resonant network is multiplied by a measure of the voltage across said network and in that a low pass filter is incorporated between the output of the multiplier and the one input of the differential amplifier.

12. Voltage controlled oscillator according to claim 10 or 11, characterized in that the multiplier is an analog multiplier.

13. Voltage controlled oscillator according to claim 10 or 11, characterized in that the multiplier is a switching multiplier.

14. Voltage controlled oscillator according to claim 8, 9, 10 or 11 in which the resonant network is of the parallel-resonant type, characterized in that an automatic gain control loop is provided in order to keep the voltage across the admittance of the resonant network constant.

15. Voltage controlled oscillator according to claim 5 in which the resonant network is of the series-resonant type, characterized in that an automatic gain control loop is provided in order to keep the current through the impedance of the resonant network constant.

16. Voltage controlled oscillator according to claim 6 in which the resonant network is of the series-resonant type, characterized in that an automatic gain control loop is provided in order to keep the current through the impedance of the resonant network constant.

17. Voltage controlled oscillator according to claim 12 in which the resonant network is of the parallel-resonant type, characterized in that an automatic gain control loop is provided in order to keep the voltage across the admittance of the resonant network constant.

18. Voltage controlled oscillator according to claim 13 in which the resonant network is of the parallel-resonant type, characterized in that an automatic gain control loop is provided in order to keep the voltage across the admittance of the resonant network constant.

* * * * *

UNITED STATES PATENT AND TRADEMARK OFFICE
CERTIFICATE OF CORRECTION

PATENT NO.  : 5,126,697
DATED       : June 30, 1992
INVENTOR(S) : Hendrikus C. Nauta; Ernst H. Nordholt It is certified that error appears in the above-identified patent and that said Letters Patent is hereby corrected as shown below:

On the title page; Item

[56] References Cited, OTHER PUBLICATIONS, line 2, after "Japanese Patent 60063471" change "data" to -- dated --.

Column 2, line 7, change "abovementioned" to -- above-mentioned --.

Column 7, line 22, change "gain large" to -- gain is large --.

UNITED STATES PATENT AND TRADEMARK OFFICE
CERTIFICATE OF CORRECTION

PATENT NO. : 5,126,697

DATED : June 30, 1992

INVENTOR(S) : Hendrikus C. Nauta; Ernst H. Nordholt

It is certified that error appears in the above-identified patent and that said Letters Patent is hereby corrected as shown below:

Column 8, line 19, before "control" insert -- a --.

Signed and Sealed this

Thirtieth Day of March, 1993

*Attest:*

STEPHEN G. KUNIN

*Attesting Officer*      Acting Commissioner of Patents and Trademarks